(12) United States Patent
Fujisawa et al.

(10) Patent No.: US 6,251,218 B1
(45) Date of Patent: Jun. 26, 2001

(54) ION BEAM PROCESSING APPARATUS

(75) Inventors: Tatsuya Fujisawa; Shotaro Ooishi, both of Hitachi; Hisao Oonuki, Hitachiota; Isao Hashimoto, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/370,172

(22) Filed: Aug. 9, 1999

(30) Foreign Application Priority Data

Aug. 10, 1998 (JP) .................................................. 10-226132

(51) Int. Cl.$^7$ ....................................................... C23F 1/02
(52) U.S. Cl. ...................... 156/345; 118/728; 118/723 FI
(58) Field of Search ........................ 118/723 FI, 723 CB, 118/719, 728, 723 R; 156/345; 204/298.04, 298.36

(56) References Cited

U.S. PATENT DOCUMENTS

| | | | |
|---|---|---|---|
| 4,278,890 | * | 7/1981 | Gruen et al. ........................... 250/492 |
| 4,446,403 | * | 5/1984 | Cuomo et al. .................. 315/111.81 |
| 4,481,062 | * | 11/1984 | Kaufman et al. ..................... 156/345 |
| 4,869,801 | * | 9/1989 | Helms et al. .......................... 204/298 |
| 5,240,583 | * | 8/1993 | Ahonen ............................. 204/298.04 |
| 5,464,475 | * | 11/1995 | Sikes et al. ........................... 118/719 |
| 5,647,945 | * | 7/1997 | Matsuse et al. ...................... 156/345 |
| 5,766,404 | * | 6/1998 | Rigali et al. .......................... 156/345 |
| 5,785,796 | * | 7/1998 | Lee ....................................... 156/345 |
| 6,056,849 | * | 5/2000 | Straemke .............................. 156/345 |
| 6,106,634 | * | 8/2000 | Ghanayem et al. ................... 134/19 |

OTHER PUBLICATIONS

Hitachi Review, vol. 68, No. 6, Jun. 1986, "Development of Large–Scale Ion Beam Milling Machines", pp. 49–52.

* cited by examiner

*Primary Examiner*—Gregory Mills
*Assistant Examiner*—Luz L. Alejandro
(74) *Attorney, Agent, or Firm*—Mattingly, Stanger & Malur, P.C.

(57) ABSTRACT

The invention aims at reducing the movement of an operator to improve the operability. A vacuum chamber door is provided on the front side of a vacuum chamber, and sample holders are connected to the vacuum chamber door through a rotation shaft and a disk. An ion source is detachably mounted on the right side of the vacuum chamber, and a control panel is provided on the left side of the vacuum chamber. The vacuum chamber door is supported by a linearly reciprocally-moving mechanism so as to be drawn away from the vacuum chamber. An operation surface of the vacuum chamber door and an operation surface of the control panel are disposed substantially in a common plane.

7 Claims, 2 Drawing Sheets

ION BEAM PROCESSING APPARATUS

BACKGROUND OF THE INVENTION

This invention relates to an ion beam processing apparatus, and more particularly to an ion beam processing apparatus provided with a large-bore ion source, which is suitably used as a processing apparatus for ion beam milling and ion beam sputtering.

An ion beam processing apparatus has heretofore been used for processing a semiconductor substrate, a magnetic head and so on, and for example, as described in Hitachi Review Vol. 68, No. 6, June 1986, there has been proposed an ion beam milling apparatus provided with a large-bore ion source in order to achieve a high throughput. This ion beam milling apparatus comprises an ion source for forming introduced gas into plasma to produce an ion beam, a processing chamber for processing samples by the ion beam emitted from the ion source, a vacuum chamber interconnecting the ion source and the processing chamber, a vacuum valve connecting the vacuum chamber to an exhaust device, and a control panel responsive to operation for effecting control concerning the processing of the samples. The ion source is formed into a large-bore design, and with this design, many samples can be processed at a time.

In the conventional apparatus, a sample holder is fixedly mounted within the processing chamber through a rotation shaft in such a manner that the sample holder is supported at its opposite sides by the rotation shaft. For loading and unloading samples relative to the sample holder, a chamber door, provided at the processing chamber so as to be opened and closed, must be opened, and therefore a space for allowing the opening and closing of the chamber door need to be provided at the front side of the chamber door. And besides, this space is provided between the chamber door and the control panel, and an operation surface of the control panel and an operation surface of the chamber door are not disposed in a common plane, and therefore the operator must move to reach these operation surfaces each time he operates the control panel, and opens and closes and the chamber door.

SUMMARY OF THE INVENTION

It is an object of the invention to provide an ion beam processing apparatus in which the movement of the operator is reduced, thereby enhancing the operability.

To attain the above object, according to the invention, there is provided an ion beam processing apparatus comprising a sample holder for holding a sample, a vacuum chamber for receiving the sample holder therein, the vacuum chamber having an introducing port for the sample holder, an ion source for applying an ion beam to the interior of the vacuum chamber, a control panel responsive to operation for effecting a control related to the processing of the sample, a vacuum chamber door for closing the sample holder introducing port, and a support mechanism fixedly mounted on the vacuum chamber door for supporting the sample holder, wherein an operation surface of the control panel and an operation surface of the vacuum chamber door are disposed substantially in a common plane.

In the above ion beam processing apparatus, there can be provided a reciprocally-moving mechanism which is connected to the vacuum chamber door, and supports the vacuum chamber door so as to reciprocally move the vacuum chamber door toward and away from the sample holder introducing port.

The above ion beam processing apparatus can have the following features.

(1) The reciprocally-moving mechanism is connected to a bottom of the vacuum chamber door, and is disposed between the bottom of the vacuum chamber door and a bed supporting the vacuum chamber.

(2) The ion source is detachably fixed to the vacuum chamber.

(3) The vacuum chamber has a fixing flange for fixing the ion source, and the ion source has a connecting flange connected to the fixing flange through a hinge mechanism, and the ion source is detachably fixed to the fixing flange through the connecting flange.

(4) The control panel is disposed adjacent to the sample holder introducing port of the vacuum chamber.

(5) The control panel is disposed adjacent to the sample holder introducing port of the vacuum chamber and in opposed relation to the ion source with the vacuum chamber interposed therebetween.

In the above construction, the operation surface of the control panel and the operation surface of the vacuum chamber door are disposed substantially in a common plane, and therefore the movement of the operator for operating the control panel and for opening and closing the vacuum chamber door can be reduced, thereby contributing the improvement of operability.

The vacuum chamber door is supported by the reciprocally-moving mechanism so as to be reciprocally moved toward and away from the sample holder introducing port, and the sample holder is fixed to the vacuum chamber door by the support mechanism. Therefore, the vacuum chamber door can be drawn apart from the vacuum chamber through the reciprocal movement by means of the reciprocally-moving mechanism, and the sample-removing or unloading operation can be easily carried out. Further, the vacuum chamber door can be drawn by the reciprocally-moving mechanism, and therefore the vacuum chamber can be reduced in size as compared with the type of vacuum chamber in which a vacuum chamber door is supported for open and close through a hinge mechanism. Furthermore, the ion source is detachably fixed to the vacuum chamber, and therefore by removing the ion source from the ion source, cleaning within the vacuum chamber and the maintenance of the ion source can be done easily.

DESCRIPTION OF THE PREFERRED EMBODIMENTS

Figure 1:
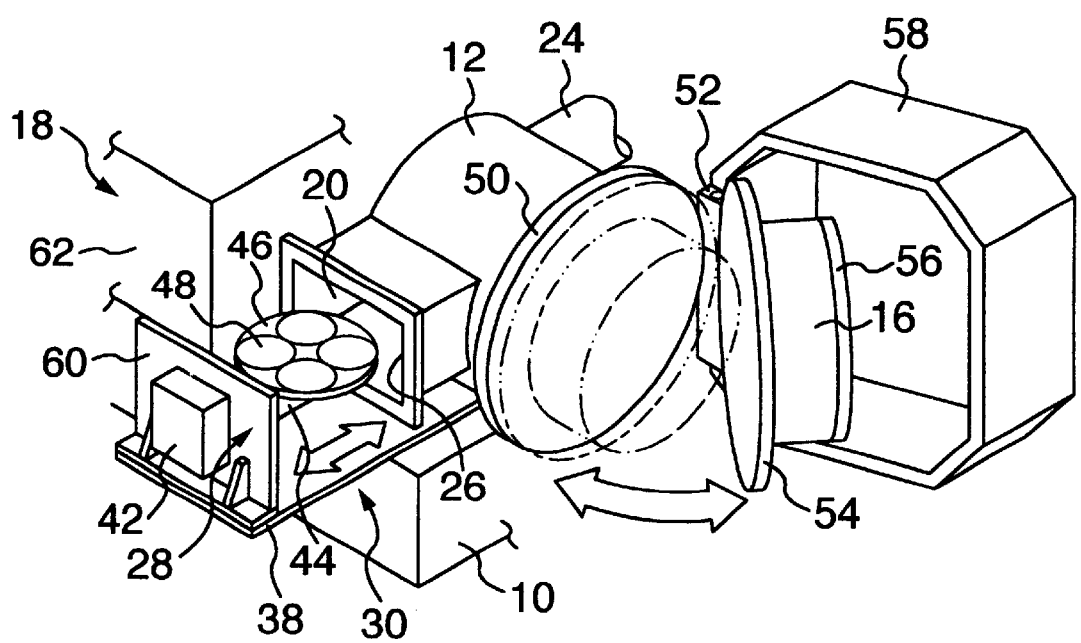
FIG. 1 is an exploded, perspective view of the essential portion of an ion beam processing apparatus showing an embodiment of the invention.

An embodiment of the invention will now be described with reference to the drawings. FIG. 1 is an exploded, perspective view of the essential portion of an ion beam processing apparatus according to the embodiment of the invention, FIG. 2 is a plan view of the ion beam processing apparatus, and FIG. 3 is a left side-elevational view of the ion beam processing apparatus.

Figure 2:
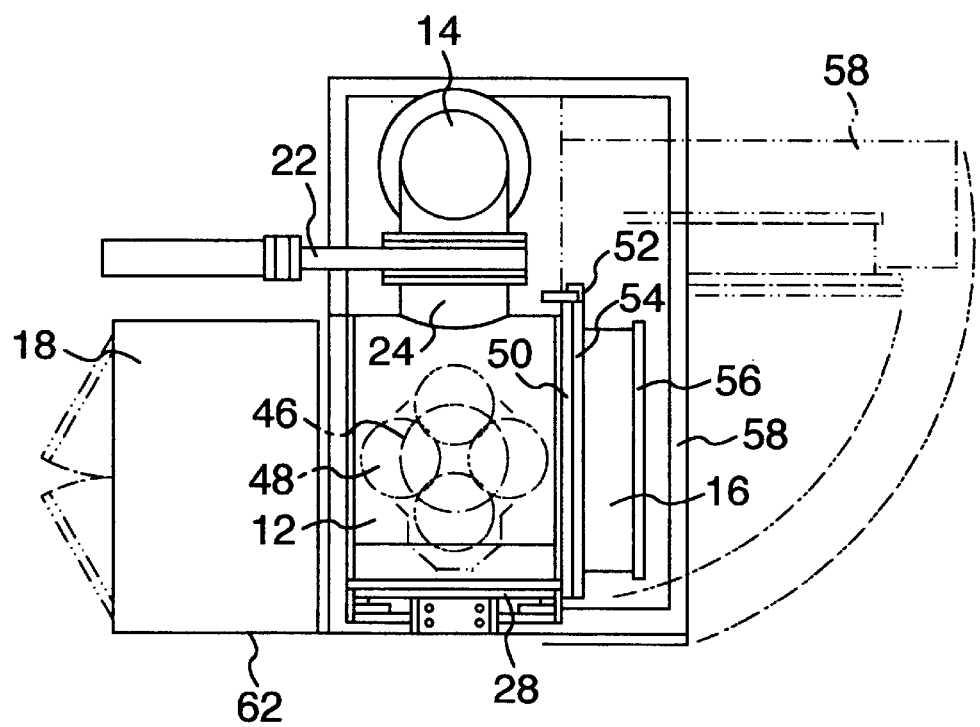
FIG. 2 is a plan view of the ion beam processing apparatus shown in FIG. 1.
Figure 3:
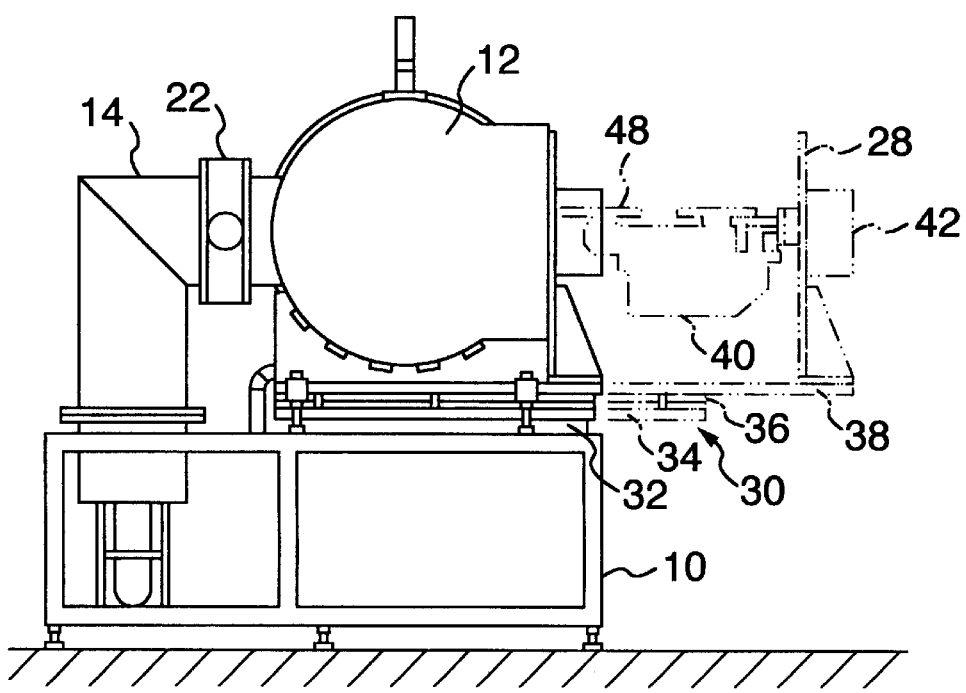
FIG. 3 is a left side-elevational view of the ion beam processing apparatus shown in FIG. 1.

In FIGS. 1 to 3, a vacuum chamber 12 is disposed on a box-shaped bed 10, and a vacuum evacuation device 14 is provided on the rear side of the vacuum chamber 12. An ion source 16 is detachably mounted on the right side of the vacuum chamber 12, and a control panel 18 is provided adjacent to the vacuum chamber 12 on the left side thereof.

Formed on the vacuum chamber 12 are a receiving chamber or processing chamber 20, an exhaust port 24, which communicates with the vacuum evacuation device 14 through a vacuum valve 22, and a sample holder introducing port 26. A vacuum chamber door 28 is detachably provided at the sample holder introducing port 26 so as to close this port 26. The vacuum chamber door 28 is fixedly mounted on a linearly reciprocally-moving mechanism 30, which is provided between the vacuum chamber 12 and the bed 10, and is reciprocally movable relative to the sample holder introducing port 26. The linearly reciprocally-moving mechanism 30 comprises rails 32, which are mounted on the bed 10, a plate 34, which is slidably mounted on the rails 32, rails 36, which are mounted on the plate 34, and a plate 38 slidably mounted on the rails 36. The vacuum chamber door 28 is fixedly mounted on a distal end portion of the plate 38. When the vacuum chamber door 28 is operated to be moved toward and away from the sample holder introducing port 26, the linearly reciprocally-moving mechanism 30 guides the linear movement of the vacuum chamber door 28 as indicated by an arrow in FIG. 1. In this case, the plate 38 is first drawn along the rails 36, and then the plate 34 is drawn along the rails 32.

On the other hand, a rotation revolution-tilt mechanism 40, serving as a support mechanism, is fixedly secured on the rear side of the vacuum chamber door 28. The rotation revolution-tilt mechanism 40 comprises a motor 42, a rotation shaft 44, and a disk 46, and the rotation shaft 44 can be tilted by a desired angle through the rotary driving of the motor 42. A plurality of sample holders 48 are rotatably mounted on the disk 46, and a sample, such as a semiconductor substrate, can be held on each sample holder 48. The disk 46 is driven for rotation by a motor, not shown, and in accordance with the rotation of the disk 46, the respective sample holders 48 are rotated in a direction opposite to the direction of rotation of the disk 46. More specifically, the motor for driving the disk 46 is connected to a planetary gear, and each sample holder 48 is rotated about its axis upon the rotation of the disk 46.

A fixing flange 50 for fixing the ion source 16 is formed at one side of the vacuum chamber 12, and a connecting flange 54 is connected to the flange 50 through a hinge mechanism 52. The flanges 50 and 54 are formed in the same shape, and the flange 54 is fixed to the flange 50 in a detachable manner, that is, in such a manner that the flange 54 can be opened and closed relative to the flange 50. The flange 54 is formed integrally with the ion source 16, and a shutter, ion source electrodes and a neutralizer are contained in an inner peripheral portion of the flange 54, and a filament is fixed to au upper lid 56 of the ion source 16. A protection cover 58 is detachably provided to cover the ion source 16 so that a person will not touch the ion source 16 to which a high voltage is applied.

Various operation switches are provided on a front surface of the control panel 18. The control panel 18 thus has the operation surface 62 disposed substantially in a common plane with an operation surface 60 of the vacuum chamber door 28 and conducts a control concerning the processing of the samples responsively to the operation of the various operation switches.

In the above construction, when an electric current is applied to the filament mounted on the upper lid 56, thermoelectrons are emitted from the filament, and make a spiral motion under the influence of a magnetic field produced by magnets that are provided at an outer peripheral portion of the ion source 16. At this time, when gas is introduced into the ion source 16, which has been evacuated to a high degree of vacuum, molecules of the gas and the thermoelectrons impinge on each other, so that the gas molecules are formed into plasma. Then, ions in this plasma are fed as an ion beam into the vacuum chamber 12 through the shutter by a voltage applied to the ion source electrodes in the ion source 16. At this time, when the shutter is opened, the ion beam is applied to the samples, which are held respectively on the sample holders 48 being rotated by the rotation revolution-tilt mechanism 40, during the opening of this shutter, thereby processing the samples. At this time, the neutralizer is energized to be heated, and emits thermoelectrons, and positive charges of the ion beam are neutralized by these thermoelectrons. After the processing of the samples on the sample holders 48 is finished, the vacuum chamber door 28 is drawn linearly, so that the samples on the sample holders 48 can be removed or unloaded. Thereafter, fresh samples are put in the sample holders 48, respectively, and then the vacuum chamber door 28 is pushed or moved toward the sample holder introducing port 26, and by doing so, the samples on the sample holders 48 can be received within the vacuum chamber 12.

In this embodiment, the operation surface 62 of the control panel 18 and the operation surface 60 of the vacuum chamber door 28 are disposed substantially in a common plane, and therefore, the distance of movement of the operator for effecting the operation of the control panel 18, the drawing and pushing of the vacuum chamber door 28, and the loading and unloading of the samples can be shortened, thereby improving the operability.

In this embodiment, since the vacuum chamber door 28 can be linearly drawn through the linearly reciprocally-moving mechanism 30, the vacuum chamber 12 can be reduced in size as compared with the type of vacuum chamber in which a vacuum chamber door is opened and closed through a hinge mechanism. And besides, the sample holders 48 are withdrawn simultaneously with the drawing of the vacuum chamber door 28, and therefore the samples can be easily loaded and unloaded.

Furthermore, as the linearly reciprocally-moving mechanism 30 is provided between the vacuum chamber 12 and the bed 10, and as the control panel 18 is disposed adjacent to the vacuum chamber 12, a floor space can be utilized efficiently, and also a compact design of the apparatus can be achieved.

In this embodiment, as the ion source 16 is detachably mounted on the flange 50 through the flange 54, after the cover 58 is first opened and then the ion source 16 is opened, the cleaning of the vacuum chamber 12 and the maintenance of the ion source 16, for example the maintenance of the ion source electrodes and the neutralizer, can be done easily.

In this embodiment, the operation surface 62 of the control panel 18 and the operation surface 60 of the vacuum chamber door 28 are disposed substantially in a common plane. Therefore, for example, the interior of a room is divided into two regions in such a manner that the boundary between the two regions lies in the plane in which the two operation surfaces 60 and 62 are disposed, and one of the two regions is used as a clean room whereas the other region is used as a utility region. By doing so, a through-the-wall system can be adopted. Namely, the operation surface-side can be distinguished in the degree of cleanness from the utility region-side, and the space in the room can be divided efficiently and economically.

As having described above, according to the present invention, as the operation surface of the control panel and the operation surface of the vacuum chamber door are disposed substantially in a common plane, the movement of the operator can be reduced, and this contributes to the enhancement of the operability.

What is claimed is:

1. An ion beam processing apparatus comprising:

a sample holder for holding a sample;

a vacuum chamber for receiving said sample holder therein, said vacuum chamber having an introducing port for said sample holder;

an ion source for applying an ion beam to an interior of said vacuum chamber;

a control panel responsive to operation for effecting a control concerning processing of said sample;

a vacuum chamber door detachably disposed at said sample holder introducing port for opening and closing said sample holder introducing port;

a support mechanism fixedly mounted on said vacuum chamber door for supporting said sample holder so that said sample holder follows opening and closing movement of said vacuum chamber door;

a reciprocally-moving mechanism connected to said vacuum chamber door and supporting said vacuum chamber door for reciprocal movement relative to said sample holder introducing port; and said vacuum chamber door having thereon an operation surface disposed substantially in a common plane to an operation surface of said control panel.

2. An ion beam processing apparatus according to claim 1, wherein said ion beam is detachably fixed to said vacuum chamber.

3. An ion beam processing apparatus according to claim 1, wherein said vacuum chamber has a fixing flange for fixing said ion source, and said ion source has a connecting flange connected to said fixing flange through a hinge mechanism, and said ion source is detachably fixed to said fixing flange through said connecting flange.

4. An ion beam processing apparatus according to claim 1, wherein said control panel is disposed adjacent to said sample holder introducing port of said vacuum chamber.

5. An ion beam processing apparatus according to claim 1, wherein said control panel is disposed adjacent to said sample holder introducing port of said vacuum chamber and in opposed relation to said ion source with said vacuum chamber interposed therebetween.

6. An ion beam processing apparatus comprising;

a sample holder for holding a sample;

a vacuum chamber for receiving said sample holder therein, said vacuum chamber having an introducing port for said sample holder:

an ion source for applying an ion beam to an interior of said vacuum chamber;

a control panel responsive to operation for effecting a control concerning processing of said sample;

a vacuum chamber door detachably disposed at said sample holder introducing port for opening and closing said sample holder introducing port;

a support mechanism fixedly mounted on said vacuum chamber door for supporting said sample holder; and a reciprocally-moving mechanism connected to said vacuum chamber door and supporting said vacuum chamber door for reciprocal movement relative to said sample holder introducing port, where said sample holder, supported by said support mechanism, is moved into and out of said vacuum chamber through reciprocal movement of said reciprocally-moving mechanism caused by opening and closing of said vacuum chamber door.

7. An ion beam processing apparatus according to claim 6, wherein said reciprocally-moving mechanism is connected to a bottom of said vacuum chamber door, and is disposed between the bottom of said vacuum chamber door and a bed supporting said vacuum chamber.

* * * * *